United States Patent
Gurusami et al.

(10) Patent No.: US 7,110,167 B2
(45) Date of Patent: Sep. 19, 2006

(54) SYSTEM AND METHOD FOR DYNAMIC RANGE EXTENSION AND STABLE LOW POWER OPERATION OF OPTICAL AMPLIFIERS USING PUMP LASER PULSE MODULATION

(75) Inventors: Aravanan Gurusami, Painted Post, NY (US); Dragan Pikula, Horseheads, NY (US); Daniel O. Ricketts, Corning, NY (US); Scott R. Dahl, Corning, NY (US); Monica K. Davis, Arlington, MA (US)

(73) Assignee: Avanex Corporation, Fremont, CA (US)

( * ) Notice: Subject to any disclaimer, the term of this patent is extended or adjusted under 35 U.S.C. 154(b) by 143 days.

(21) Appl. No.: 10/896,611

(22) Filed: Jul. 20, 2004

(65) Prior Publication Data

US 2006/0018007 A1   Jan. 26, 2006

(51) Int. Cl.
*H01S 3/0941* (2006.01)
(52) U.S. Cl. .................................. 359/341.3
(58) Field of Classification Search ............. 359/341.3, 359/341.31
See application file for complete search history.

(56) References Cited

U.S. PATENT DOCUMENTS

| | | | |
|---|---|---|---|
| 5,563,732 A * | 10/1996 | Erdogan et al. | 359/341.31 |
| 6,215,809 B1 | 4/2001 | Ziari et al. | |
| 6,760,152 B1* | 7/2004 | Ratoff et al. | 359/341.3 |
| 2003/0128420 A1 | 7/2003 | Ratoff et al. | |
| 2004/0066551 A1 | 4/2004 | Lelic et al. | |

FOREIGN PATENT DOCUMENTS

EP          001113540 A1 *   7/2001

OTHER PUBLICATIONS

EP Search Report, Application No. 05 106 629.8, dated Oct. 17, 2005.

* cited by examiner

*Primary Examiner*—Mark Hellner
(74) *Attorney, Agent, or Firm*—Patterson & Sheridan, LLP

(57) ABSTRACT

An optical amplifier system comprises an optical gain medium receiving an input optical signal and outputting an amplified optical signal and a pump laser optically coupled to an input of the optical gain medium, wherein the pump laser emits a series of pulses to the optical gain medium, the pulses being emitted during coherence collapse operation of the pump laser, the time between pulses being shorter than an excited state lifetime of the optical gain medium.

20 Claims, 4 Drawing Sheets

SYSTEM AND METHOD FOR DYNAMIC RANGE EXTENSION AND STABLE LOW POWER OPERATION OF OPTICAL AMPLIFIERS USING PUMP LASER PULSE MODULATION

FIELD OF THE INVENTION

The present invention relates to fiber-optic communications networks, and more particularly, to optical network equipment such as optical amplifiers in which pump powers are controlled to permit pumping under a wide dynamic power range and having stable operation at low pump powers.

BACKGROUND OF THE INVENTION

Optical Amplifiers, such as the well-known Erbium Doped amplifier, are pumped by a laser source, typically a laser diode, to derive signal gain. Conventional optical amplifier systems implement power control of the amplifier by changing the DC drive current applied to the pump laser diode so as to control the pump power supplied to a gain medium. This method is used to ensure that the optical amplifier operates at a certain power set point. Unfortunately, when the set point is such that the pump laser is operated near its lasing threshold, reflections in the optical path (from anywhere between the pump and the gain medium) can cause drastic fluctuations in the pump operation. When the pump laser is operated close to its threshold, such reflections and other perturbing effects may cause the pump laser to either drop below threshold or to change its output mode. Such fluctuations cause undesirable wide excursions in the pump output power that limit the stability both the pump and the amplifier under low power operation. Additionally, pump bistability may occur at currents significantly above threshold, once again limiting the stability and operation of the amplifier/pump.

Conventional solutions to stabilize the output power of amplifier pump lasers include the use of Fiber Bragg Gratings (FBGs) to stabilize pump wavelength and/or power and pump current dither circuits to stabilize pump power. Pump stabilization designs using FBGs alone impose tight pump laser manufacturing specifications on parameters such as front facet reflectivity and pump laser wavelength control, the latter in order to control detuning between the FBG wavelength and the laser wavelength, on the order of a few to several nm. The FBG designs for good power stability also typically require long fiber lengths and one or more FBGs in the fiber pigtail at one or more meters from the pump chip, both leading to higher cost.

Although the use of FBGs provides a stable wavelength of operation for the pump at high output powers, it, unfortunately, does not ensure pump power stability at very low power. As the drive current to an externally stabilized pump laser is increased through and above the lasing threshold, the device will commence laser operation in a single mode external cavity state and will, later, transition to the more stable multi-mode coherence collapse regime. The critical current at which the stable multi-mode operation occurs is determined by many interacting pump parameters. Minimizing this critical current typically requires increasing laser facet reflectivity and decreasing the FBG reflectivity. Unfortunately, however, designs for high power and/or operation over a wide temperature range (so-called "uncooled" pumps) both typically require extremely low laser front facet reflectivity. Low laser facet reflectivity enhances undesirable low power bistability and compounds the design problem. Further, FBG designs for stable power operation at the high power end of the pump operating range require the use of stronger gratings and lower front facet reflectivity, both situations detrimental for low power stabilization. Finally, in an uncooled pump, it is not possible to maintain tight detuning ranges on the order of a few nm, when the native pump wavelength shifts by 25 nm or more.

The conventional dither circuit technique for controlling pump power utilizes a small, continuous variation in the pump current wherein the rate of variation exceeds the excited state lifetime of the amplifier active gain medium. The dither circuit is typically implemented using additional circuit elements such as a bias control circuit. Disadvantageously, this second conventional method of pump control does not improve pump stability at very low power (near threshold) and adds complexity of additional circuit management.

Based upon the above discussions, it is concluded that there is a need, in the art, for an improved system and method for controlling optical amplifier output power. The improved system and method should be capable of controlling the pump laser in such a fashion that the optical amplifier output is stable over a wide range of output powers that includes low powers. The present invention addresses such a need.

SUMMARY OF THE INVENTION

In order to address the above-described need in the art, the present invention discloses a system and method for controlling an optical amplifier wherein a gain medium of the amplifier receives optical excitation from a pulse-width modulated pump source, the time interval and between successive controlled duration (or controlled width) pulses of the pump source being much less than the lifetime of the excited state of pumped ions, such as Erbium ions, within the gain medium. Because the pump laser, when it is outputting a pulse, always operates at a current that is above the threshold current and that is also above the critical current level associated with coherence collapse operation, the pump operates in the stable coherence collapse regime. The pulse width may be adjusted (i.e., modulated) so as to produce an average power that matches a predetermined set point. By pulsing the laser pump light source, mode hopping of the pump laser is avoided within fast cycles and is averaged between multiple cycles, thereby leading to a stable output power for the amplifier at any output power. As a result, the gain medium also produces a stable output.

A preferred embodiment of a system for an optical amplifier in accordance with the present invention comprises an optical gain medium receiving an input optical signal and outputting an amplified optical signal; a pump laser diode optically coupled to an input of the optical gain medium; one or more fiber Bragg gratings optically coupled between the pump laser diode and the optical gain medium; a pump driver electrically coupled to the pump laser diode and providing a pulsed drive current to the pump laser diode, a pump controller optically coupled to the pump driver and providing a pulsed control signal to the pump driver; and a photo-detector optically coupled to an output of the optical gain medium and electrically coupled to the pump controller, wherein the pulsed control signal causes the pulsed drive current to alternately be less than and greater than the critical drive current associated with coherence collapse operation of the pump laser.

A preferred embodiment of a method for controlled operation of an optical amplifier in accordance with the present invention comprises the steps of inputting an input optical signal to an optical gain medium, inputting pulsed light from a pump laser diode to the optical gain medium and outputting an amplified optical signal from the optical gain medium, wherein the power of each pulse of the pulsed light is greater than a power associated with the onset of coherence collapse operation of the pump laser.

BRIEF DESCRIPTION OF THE DRAWINGS

The object and features of the present invention can be more fully understood and better appreciated with reference to the attached drawings, wherein.

DETAILED DESCRIPTION OF THE PREFERRED EMBODIMENTS

The present invention provides an improved system and method and for optical amplifier control within optical communications systems. The following description is presented to enable one ordinary skill in the art to make and use the invention and is provided in the context of a patent application and its requirements. Various modifications to the preferred embodiments will be readily apparent to those skilled in the art and the generic principles described herein may be applied to other embodiments. Thus, the present invention is not intended to be limited to the embodiments shown but is to be accorded the widest scope consistent with the principles and features described herein. In order to gain a detailed understanding of the invention, the reader is referred to the appended FIGS. 1–4 in conjunction with the following description. It is to be understood that the drawings are diagrammatic and schematic representations only and are neither limiting of the scope of the present invention nor necessarily drawn to scale.

Figure 1:
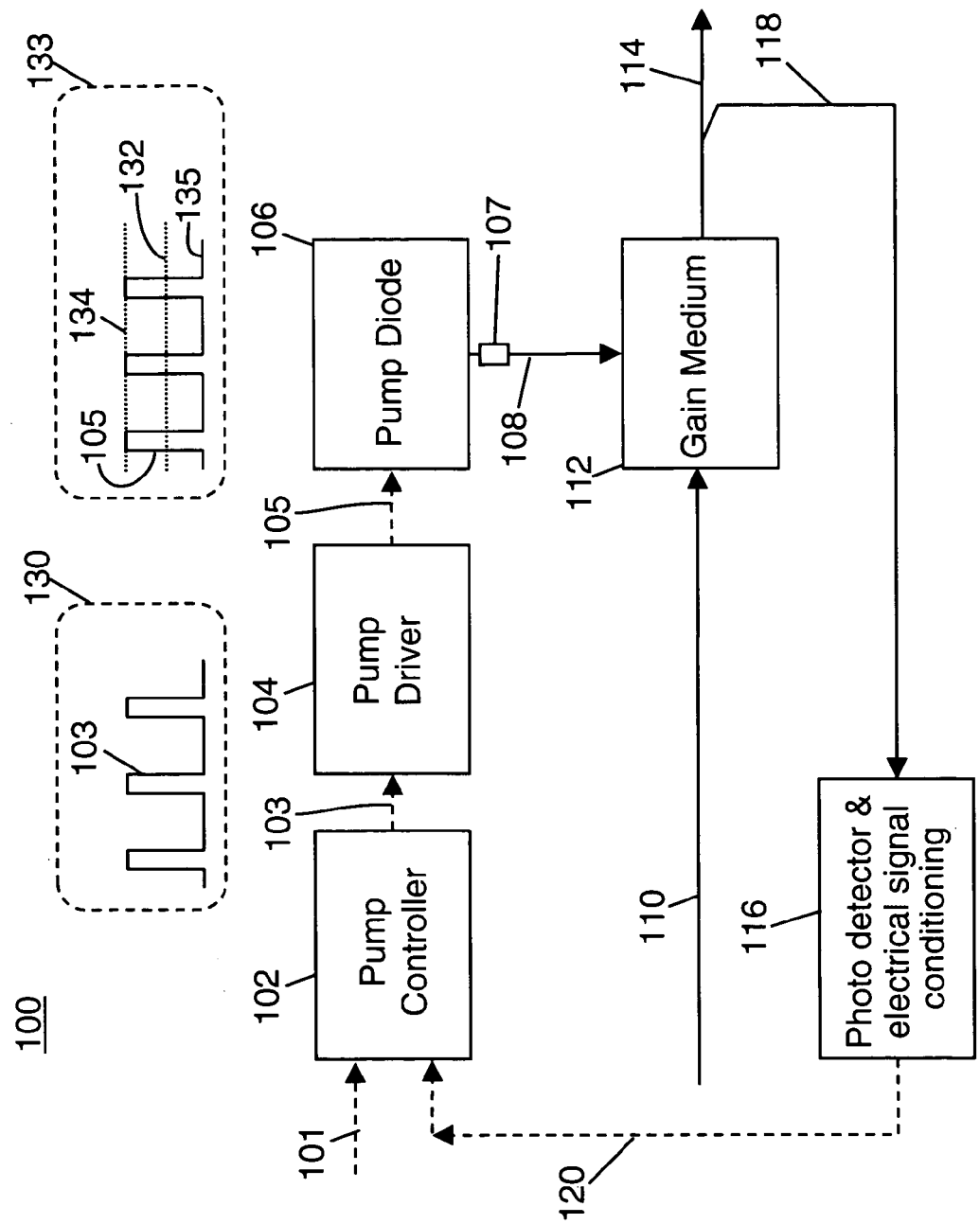
FIG. 1 is a schematic illustration of a preferred embodiment of a system, in accordance with the present invention, for controlling an optical amplifier.

FIG. 1 is a schematic illustration of a preferred system, in accordance with the present invention, for controlling an optical amplifier. In FIG. 1, dashed arrows represent pathways of electrical or electronic signals and solid arrows represent pathways of light or of optical signals. Preferably, the optical pathways (solid arrows) are realized by or comprised of, in whole or in part, of optical fibers and any associated focusing, collimating or other optics needed to inject light into and extract light out of the optical fibers. However, one of ordinary skill in the art will readily recognize that the various optical pathways may be constructed using, for instance, free-space optics such as mirrors, prisms and lenses, or using planar waveguides, etc.

The system 100, shown in FIG. 1 comprises an optical gain medium 112, preferably an Erbium doped fiber, receiving an input optical signal 110 and outputting an amplified optical signal 114 and a pump laser diode 106 optically coupled to the optical gain medium 112 and providing a pulsed laser light 108 to an input of the gain medium 112. The system 100 (FIG. 1) may further comprise at least one fiber Bragg grating 107 optically coupled between the pump laser diode 106 and the optical gain medium 1112, a pump driver 104 electrically coupled to the pump laser diode 106 and providing a pulsed drive current 105 to the pump laser diode, a pump controller 102 optically coupled to the pump driver 104 and providing a pulsed electric control signal 103 to the pump driver 104 and a unit 116 comprising a photodetector and electrical signal conditioning electronics optically coupled to an output of the optical gain medium 112 and electrically coupled to an input of the pump controller 102.

The unit 116 of the system 100 (FIG. 1) receives a sample portion 118 of the amplified output 114 of the gain medium and outputs an electrical signal 120 to the pump controller 102. The electrical signal 120 provides, to the pump controller, information related to the optical power contained within the sample portion 118 and the amplified output 114. The pump controller compares the information provided in the electrical signal 120 to the desired amplifier set point information, this latter set point information provided in an electrical signal 101.

The pump controller 102 of the system 100 (FIG. 1) provides a pulsed control signal 103 to the pump driver 104. The pump driver 104 then produces a pulsed drive current 105 that is sent to the pump diode 106. Schematic illustrations of the temporal variations of the control signal 103 and the drive current 105 are shown in box 130 and box 133, respectively. The form of the pulsed drive current 105 is related to the information provided in the pulsed control signal 103. The pulsed drive current 105 alternately attains a low level 134 and a high level 134 that is greater than the critical drive current associated with coherence collapse operation of the pump laser diode 106. These alternating low and high drive current levels produce alternating low and high lasing output 108 of the pump laser diode 106. The one (or more) FBG(s) 107 provide wavelength selective feedback to the pump laser diode 106 such that the lasing wavelength of the pump laser diode 106 remains constant as a function of drive current and/or as a function of laser diode temperature. Because of the periodicity of the drive current 105, the drive current assumes a time-averaged level 132, which is of an appropriate magnitude to cause the power of the output signal level 114 to match the desired set point. The time-averaged level is determined by either the heights (amplitudes) or widths (or both) of the pulses of the drive current 105. If the high level 134 is maintained constant and only the pulse widths (i.e., durations) are changed in response to changing set points, then the drive current is termed a "Pulse Width Modulated Drive Current".

The stepwise control of the pump current within the system 100 occurs with a period that is longer than time constants (fractions of a microsecond) of all current-dependent physical and/or electronic properties of the pump waveguide of the pump laser diode 106 that affect the lasing output. The variation of such properties, which may include temperature, temperature gradients, thermal diffusion, carrier density, refractive index, etc., as a result of the pulsed pump drive current causes modulation of the lasing Fabry Perot (FP) modes. This cavity mode modulation enhances the ability of the device to drop into a stable multi-mode coherence collapse regime at a coherent (power) level lower than would otherwise be possible. The minimum achievable power in this case is limited only by the ability of the electronic circuit and not the pump itself. This method also lends itself to simple digital drive solution. Further, because the time interval between successive pulses emitted by the pump laser diode 106 is much less than the lifetime of the excited state of pumped ions within the gain medium, the gain medium continues to provide amplification gain to the optical signal 110, even during those intervals during which the pump diode 106 is emitting low power output. For instance, for an Erbium-bearing gain medium, such as Er-doped fiber, the lowest frequency of pulses that may be used will be limited by the rejection needed from the Erbium low pass characteristics. Appropriate frequency of modulation must be chosen in order to reduce the impact on signal transmission. For example in a 980 nm pump, a frequency of 3 MHz will provide about 30 dB rejection due to Erbium characteristics. Depending upon the power level and pump wavelength, other suitable frequencies can be devised to achieve required performance.

Figure 2:
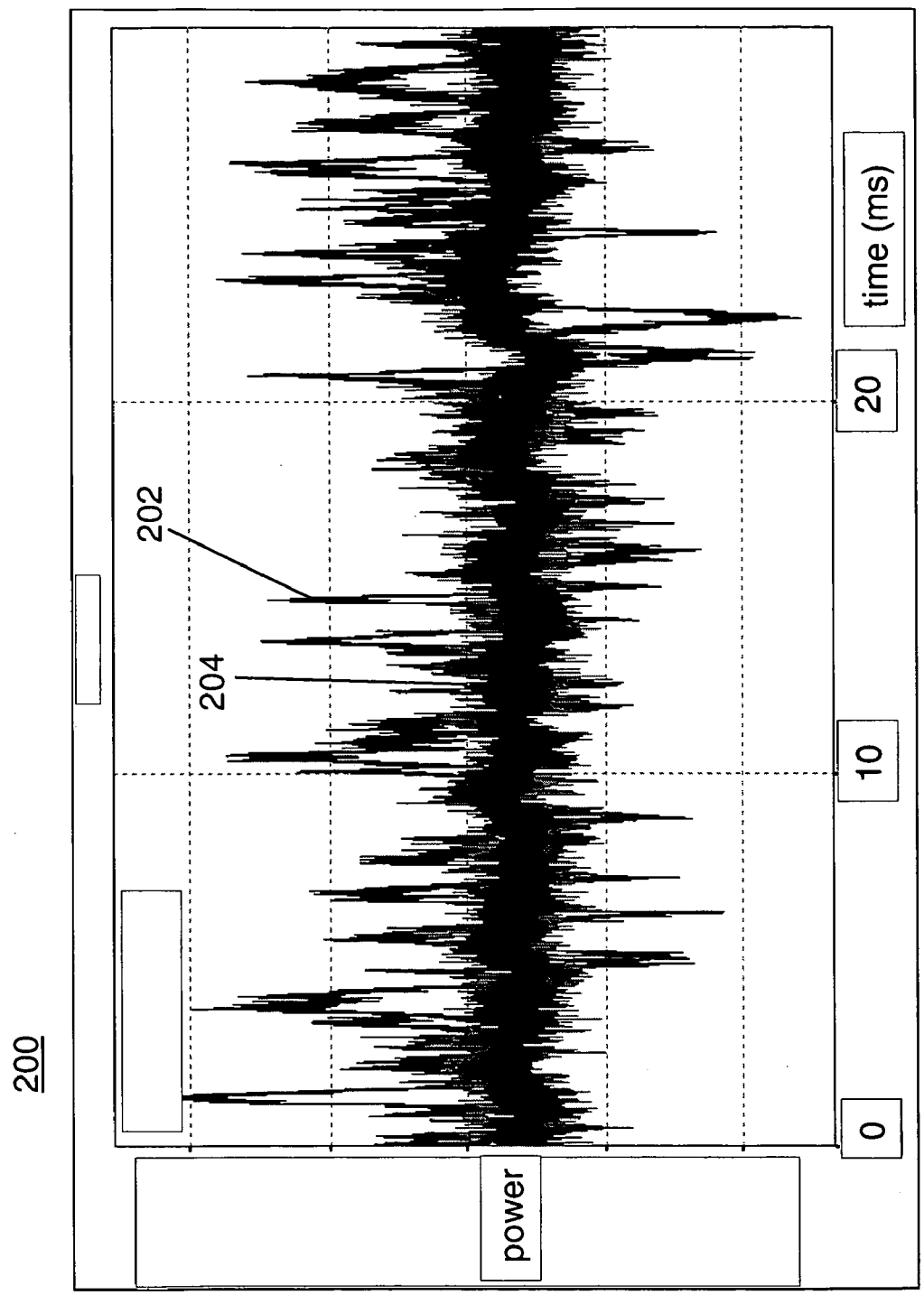
FIG. 2 is an illustration of power of an optical amplifier at low output levels using both the conventional control method and using a control method in accordance with the present invention.
Figure 3:
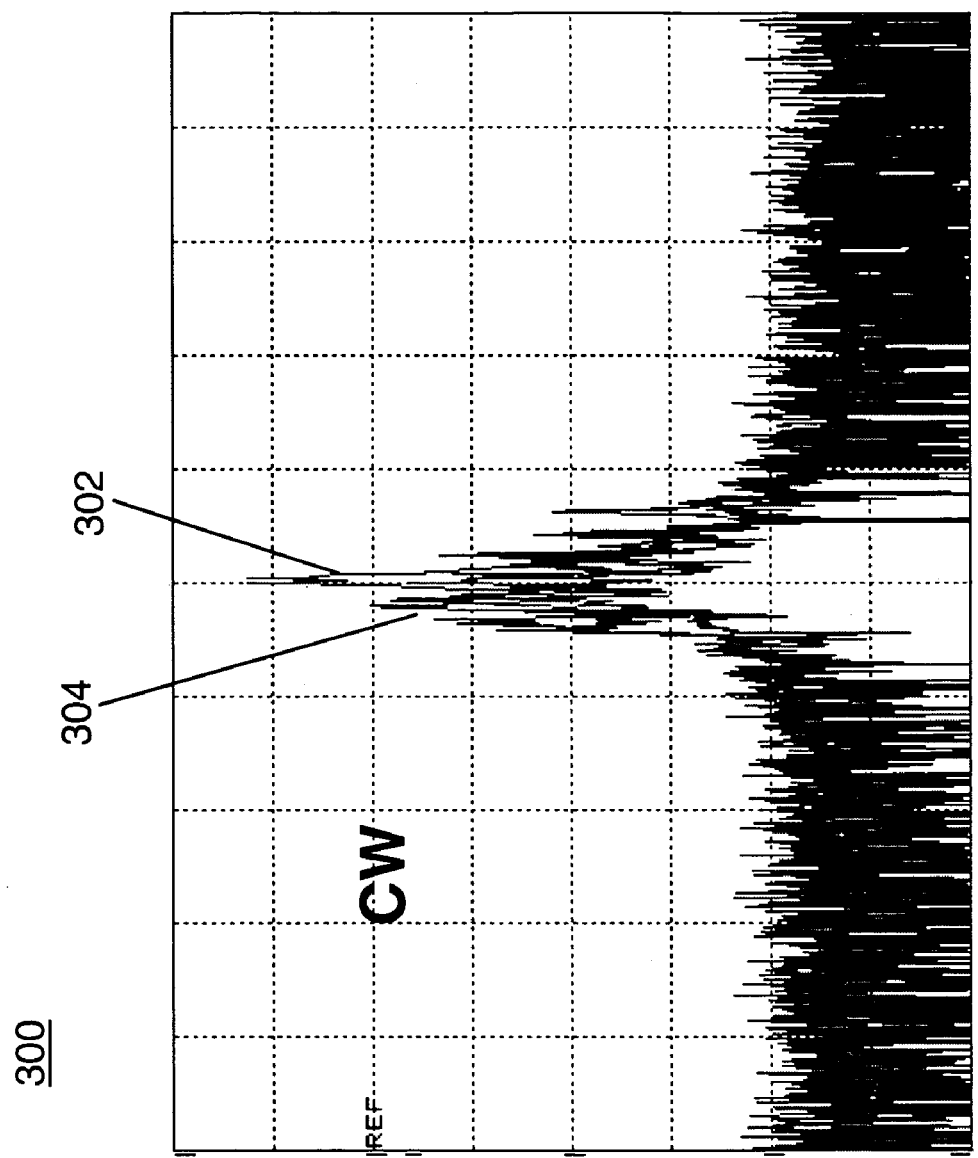
FIG. 3 is an illustration of a spectrum of the output of a pump laser operated at low power using conventional continuous drive current.
Figure 4:
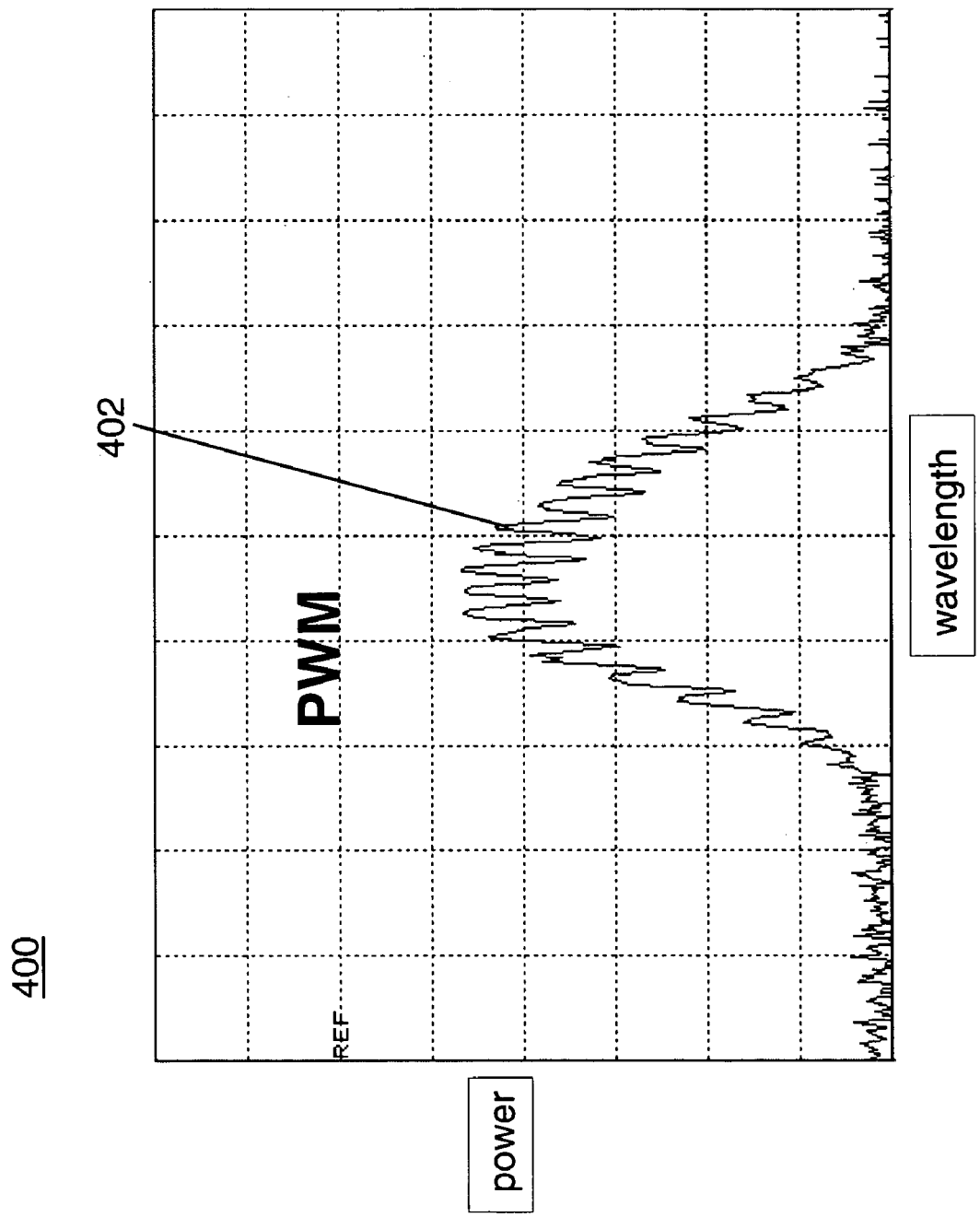
FIG. 4 is an illustration of a spectrum of a pump laser operated at low average power but high pulse power using a pulsed drive current method in accordance with the present invention.

FIGS. 2–4 illustrate performance comparisons between the operation of an optical amplifier control system in accordance with the present invention and the operation of conventionally controlled optical amplifiers. FIG. 2 shows measured output powers, vs time, of optical amplifiers operated at low power output levels. The trace 202 relates to an optical amplifier that uses the conventional drive method in which drive current is applied continuously to the laser diode pump. The trace 204 relates to an optical amplifier that is operated in accordance with the present invention, as described with respect to the system 100, and that is operated at an average pump drive current that is equal to the continuous pump drive current applied to the laser diode pump associated with the other trace 202. It is readily observed from FIG. 2 that the power output, trace 204, of an amplifier operated in accordance with the present invention does not have the large power fluctuations associated with the conventionally operated amplifier.

FIG. 3 is an illustration of a spectrum, plotted in wavelength along the bottom axis, of the output of a pump laser operated at low power using the conventional continuous drive current method. The spectrum alternates between two possible outputs, shown as traces 302 and 304, that result from mode hopping (and consequent power instability) between only Fabry Perot modes and that are indicative of unstable pump spectrum operation. By comparision, FIG. 4 is an illustration of a spectrum of a pump laser operated at low average power but according to the pulsed drive current method in accordance with the present invention. The broadened pump spectrum shown in trace 402 is characteristic of the multi-mode coherence collapse regime (with associated stable power performance) with many Fabry Perot modes extending throughout the full emission bandwidth.

An improved system and method for controlled optical amplifier operation have been disclosed. Compared to conventional systems and methods for controlling an optical amplifier, the system and method in accordance with the present invention provides the advantages of:

1. Extending the dynamic range of pumps from their maximum operating power to near zero, this attribute being limited only be the circuit and not by the pump itself;
2. Not requiring any changes to the pump and, providing an environment within which pump costs (materials, yield, etc.) and pump physical dimensions (pigtail length, number of Fiber Bragg Gratings) might be advantageously reduced;
3. Providing the groundwork for a simple, low cost digital control system.
4. Reducing the net heat generated by the combined electronics and pump ensemble, as compared to linear drive controls (an advantage especially for uncooled pumps);
5. Permitting pump operation up to its maximum rated power (whereas dither modulation is, by definition, limited to the power corresponding to the maximum mean current);
6. Enabling stable power operation of uncooled pumps across a wide temperature range (whereas Fiber Bragg Grating stabilization has difficulty maintaining power stabilization while maintaining wavelength stabilization across the resulting very wide detuning range).

Although the present invention has been disclosed in accordance with the embodiments shown, one of ordinary skill in the art will readily recognize that there could be variations to the embodiments and those variations would be within the spirit and scope of the present invention. Many modifications might readily be envisioned or practiced by one of skill in the art without departing from the spirit and scope of the appended claims, which claims alone define the invention.

What is claimed is:

1. An optical amplifier system comprising:
   an optical gain medium receiving an input optical signal and outputting an amplified optical signal;
   a pump laser optically coupled to an input of the optical gain medium, wherein the pump laser emits a series of pulses to the optical gain medium, the pulses being emitted during coherence collapse operation of the pump laser, the time between praises being shorter than an excited state lifetime of the optical gain medium; and
   a photo-detector and electrical signal conditioning unit optically coupled to an output of the optical gain medium and coupled to the pump laser.

2. The system of claim 1, wherein the pump laser is a laser diode.

3. The system of claim 2, wherein the time between pulses is longer than a time constant of a property of a waveguide of the laser diode, the property affecting the lasing output of the pump laser.

4. The system of claim 1, wherein the power of the amplified optical signal is controlled by the widths of the pulses.

5. The system of claim 1, wherein the power of the amplified optical signal is controlled by the amplitude of the pulses.

6. The system of claim 1, wherein the power of the amplified optical signal is controlled by the amplitude and the width of the pulses.

7. The system of claim 1, further comprising a fiber Bragg grating optically coupled between the optical gain medium and the pump laser.

8. The system of claim 1, wherein the optical gain medium is an Erbium-doped fiber.

9. The system of claim 1, further comprising:
   a pump laser driver electrically coupled to the pump laser diode and providing a pulsed drive current to the pump laser; and
   a pump controller optically coupled to the pump laser driver and providing a pulsed control signal to the pump laser driver, the pump controller electrically coupled to the photo-detector and electrical signal conditioning unit,
   wherein the pulsed control signal causes the pulsed drive current to alternately be less than and greater than a critical drive current associated with coherence collapse operation of the pump laser.

10. The system of claim 9, wherein the pump controller receives, from the photo-detector and electrical signal conditioning unit, a first electrical signal related to the power of the amplified optical signal and receives a second signal related to a desired set point and adjusts the widths of pulses of the pulsed control signal so as to match the power of the amplified optical signal to the set point.

11. A method of controlling an optical amplifier, comprising the steps of:
   inputting an input optical signal to an optical gain medium;
   inputting a series of pulses of laser light from a pump laser to the optical gain medium;
   directing a sample portion of the amplified optical signal to a photo-detector and electrical signal conditioning unit;
   directing a first electrical signal related to the power of the sample proportion from the photo-detector and electrical signal conditioning unit to a pump controller;
   inputting a second electrical signal providing power set point information to the pump controller;
   directing a pulsed electrical signal from the pump controller to a pump laser driver;
   directing a pulsed drive current from the pump laser driver to the pump laser, wherein the characteristics of the pulsed electrical signal and the pulsed drive current are determined by the first and second electrical signals; and
   outputting an amplified optical signal from the optical gain medium, wherein the pulses are emitted during coherence collapse operation of the pump laser, wherein the time between pulses is shorter than an excited state lifetime of the optical gain medium.

12. The method of claim 11, wherein the pump laser is a laser diode.

13. The method of claim 12, wherein the time between pulses is longer than a time constant of a property of a waveguide of the laser diode, the property affecting the lasing output of the pump laser.

14. The method of claim 11, wherein the power of the amplified optical signal is controlled by the widths of the pulses.

15. An optical amplifier system comprising:
   an optical gain medium receiving an input optical signal and outputting an amplified optical signal;
   a pump laser optically coupled to an input of the optical gain medium, wherein the pump laser emits a series of pulses to the optical gain medium, the pulses being emitted during multi-mode operation of the pump laser, the time between pulses being shorter than an excited state lifetime of the optical gain medium;
   a pump laser driver electrically coupled to the pump laser diode and providing a pulsed drive current to the pump laser;
   a pump controller optically coupled to the pump laser driver and providing a pulsed control signal to the pump laser driver, and
   a photo-detector and electrical signal conditioning unit optically coupled to an output of the optical gain medium and electrically coupled to the pump controller, wherein the pulsed control signal causes the pulsed drive current to alternately be less than and greater than a critical drive current associated with coherence collapse operation of the pump laser.

16. The system of claim 15, wherein the pump laser is a laser diode.

17. The system of claim 16, wherein the time between pulses is longer than a thermal diffusion time constant of a waveguide of the laser diode.

18. The system of claim 15, wherein the power of the amplified optical signal is controlled by the widths of the pulses.

19. The system of claim 15, further comprising a fiber Bragg grating optically coupled between the optical gain medium and the pump laser.

20. The system of claim 15, wherein the pump controller receives, from the photo-detector and electrical signal conditioning unit, a first electrical signal related to the power of the amplified optical signal and receives a second signal related to a desired set point and adjusts the widths of pulses of the pulsed control signal so as to match the power of the amplified optical signal to the set point.

* * * * *